United States Patent
Aronov et al.

(10) Patent No.: US 11,495,835 B2
(45) Date of Patent: Nov. 8, 2022

(54) MANAGEMENT OF LARGE STACKS OF BATTERY CELLS

(71) Applicant: StoreDot Ltd., Herzeliya (IL)

(72) Inventors: Daniel Aronov, Netanya (IL); Avraham Edelshtein, Herzelia (IL); Simon Litsyn, Tel Aviv (IL)

(73) Assignee: STOREDOT LTD., Herzeliya (IL)

( * ) Notice: Subject to any disclaimer, the term of this patent is extended or adjusted under 35 U.S.C. 154(b) by 693 days.

(21) Appl. No.: 16/293,684

(22) Filed: Mar. 6, 2019

(65) Prior Publication Data

US 2020/0287248 A1    Sep. 10, 2020

(51) Int. Cl.
*G01R 31/392* (2019.01)
*H01M 10/42* (2006.01)
(Continued)

(52) U.S. Cl.
CPC ........ *H01M 10/425* (2013.01); *G01R 31/382* (2019.01); *G01R 31/392* (2019.01);
(Continued)

(58) Field of Classification Search
CPC ............. H01M 10/425; H01M 10/441; H01M 2220/20; H01M 2010/4271; H01M 2010/4278; H02J 7/005; H02J 7/0014; H02J 7/0048; Y02E 60/10; G01R 31/382; G01R 31/392; Y02T 10/70
See application file for complete search history.

(56) References Cited

U.S. PATENT DOCUMENTS 4,576,244 A * 3/1986 Zeigner ................. G01G 19/44
                                                 177/245
5,931,245 A * 8/1999 Uetake ..................... B62H 1/04
                                                  180/65.8
(Continued)

FOREIGN PATENT DOCUMENTS

WO    WO 2018/109774 A1    6/2018

OTHER PUBLICATIONS

U.S. Appl. No. 16/243,190, filed Jan. 9, 2019, Kuks et al.

*Primary Examiner* — Richard Isla
*Assistant Examiner* — Johali A Torres Ruiz
(74) *Attorney, Agent, or Firm* — Reches Patents

(57) ABSTRACT

Methods and systems are provided for optimizing usage of a large number of battery cells, some, most or all of which are fast charging cells, and possibly arranged in battery modules—e.g., for operating an electric vehicle power train. Methods comprise deriving an operation profile for the battery cells/modules for a specified operation scenario and specified optimization parameters, operating the battery cells/modules according to the derived operation profile, and monitoring the operation of the battery cells/modules and adjusting the operation profile correspondingly. Systems may be configured to balance cell/module parameters among modules, to have parallel supplemental modules and/or serial supplementary cells in the modules, and/or have supplemental modules and circuits configured to store excessive charging energy for cells groups and/or modules—to increase the cycling lifetime and possibly the efficiency of the systems. Disclosed redundancy management improves battery performance and lifetime.

24 Claims, 10 Drawing Sheets

(51) Int. Cl.
*H02J 7/00* (2006.01)
*H01M 10/44* (2006.01)
*G01R 31/382* (2019.01)

(52) U.S. Cl.
CPC ......... *H01M 10/441* (2013.01); *H02J 7/0014* (2013.01); *H01M 2010/4271* (2013.01); *H01M 2010/4278* (2013.01); *H01M 2220/20* (2013.01)

(56) References Cited

U.S. PATENT DOCUMENTS

| | | | |
|---|---|---|---|
| 9,472,804 | B2 | 10/2016 | Burshtain et al. |
| 10,096,859 | B2 | 10/2018 | Burshtain et al. |
| 10,110,036 | B2 | 10/2018 | Aronov |
| 10,199,677 | B2 | 2/2019 | Drach et al. |
| 2010/0261043 | A1* | 10/2010 | Kim ................. H01M 10/4207 429/61 |
| 2012/0053771 | A1* | 3/2012 | Yoshida ................. B60L 55/00 701/22 |
| 2012/0105001 | A1* | 5/2012 | Gallegos ............... H02J 7/0027 320/109 |
| 2012/0133310 | A1* | 5/2012 | Lee ....................... H02J 7/0024 320/117 |
| 2012/0187907 | A1* | 7/2012 | Nysen ................ H01M 10/052 320/116 |
| 2016/0149421 | A1* | 5/2016 | White .................. H02J 7/0021 320/121 |
| 2017/0294687 | A1 | 10/2017 | Burshtain et al. |
| 2018/0050602 | A1 | 2/2018 | Aronov |
| 2018/0212236 | A1 | 7/2018 | Jacob et al. |
| 2018/0241097 | A1* | 8/2018 | Yamasaki ............. H01M 10/48 |
| 2019/0366874 | A1* | 12/2019 | Bryngelsson ........... B60L 58/24 |
| 2020/0328622 | A1* | 10/2020 | Abu Qahouq .......... B60L 53/54 |
| 2021/0094435 | A1* | 4/2021 | Rechkemmer ...... H02J 7/00034 |

* cited by examiner

- 302: Optimizing usage of multiple battery cells in battery modules
- 304: Grouping the battery cells into battery modules according to monitored battery parameters and carrying out the operation of the battery cells group-wise with respect to the battery modules
- 306: Grouping of the cells into modules to make a variability of the battery cells within the battery modules smaller than a variability between the battery modules
- 308: Re-grouping the battery cells into battery modules upon changes in the specified operation scenario and/or the specified optimization parameters
- 310: Deriving an operation profile for the battery modules for a specified operation scenario and specified optimization parameters
- 320: Operating the battery modules according to the derived operation profile
- 330: Monitoring the operation of the battery modules and adjusting the operation profile correspondingly
- 340: Monitoring battery module parameters, estimating expected module cycling lifetimes and balancing module SoH by adjusting charging currents, charging rates and/or charging times as components of the operation profile to balance resulting cycling lifetimes of all the modules
- 345: Increasing the cycling lifetime of deteriorated module(s) by reducing the cycling lifetime of regularly operable module(s), to balance the cycling lifetimes over all modules

Figure 9

MANAGEMENT OF LARGE STACKS OF BATTERY CELLS

BACKGROUND OF THE INVENTION

1. Technical Field

The present invention relates to the field of energy storage devices, and more particularly, to battery cells management.

2. Discussion of Related Art

More and more systems, such as electric vehicles, utilize large stacks of battery cells for providing the respective power requirements.

SUMMARY OF THE INVENTION

The following is a simplified summary providing an initial understanding of the invention. The summary does not necessarily identify key elements nor limits the scope of the invention, but merely serves as an introduction to the following description.

One aspect of the present invention provides a method of optimizing usage of a plurality of battery cells arranged in battery modules, wherein at least some of the battery cells are fast charging cells, configured to be chargeable at least at 5C, the method comprising: deriving an operation profile for the battery modules for a specified operation scenario and specified optimization parameters, operating the battery modules according to the derived operation profile, and monitoring the operation of the battery modules and adjusting the operation profile correspondingly.

One aspect of the present invention provides a system comprising: a plurality of battery cells, at least some of which being fast charging cells, configured to be chargeable at least at 5C, wherein the battery cells are arranged in battery modules, connected in parallel, a management module configured to derive an operation profile for the battery modules for a specified operation scenario and specified optimization parameters, and to operate the battery modules according to the derived operation profile, and a monitoring module associated with the management module and configured to monitor the operation of the battery modules and adjust the operation profile correspondingly.

These, additional, and/or other aspects and/or advantages of the present invention are set forth in the detailed description which follows; possibly inferable from the detailed description; and/or learnable by practice of the present invention.

BRIEF DESCRIPTION OF THE DRAWINGS

For a better understanding of embodiments of the invention and to show how the same may be carried into effect, reference will now be made, purely by way of example, to the accompanying drawings in which like numerals designate corresponding elements or sections throughout.

In the accompanying drawings.

DETAILED DESCRIPTION OF THE INVENTION

Figure 1:
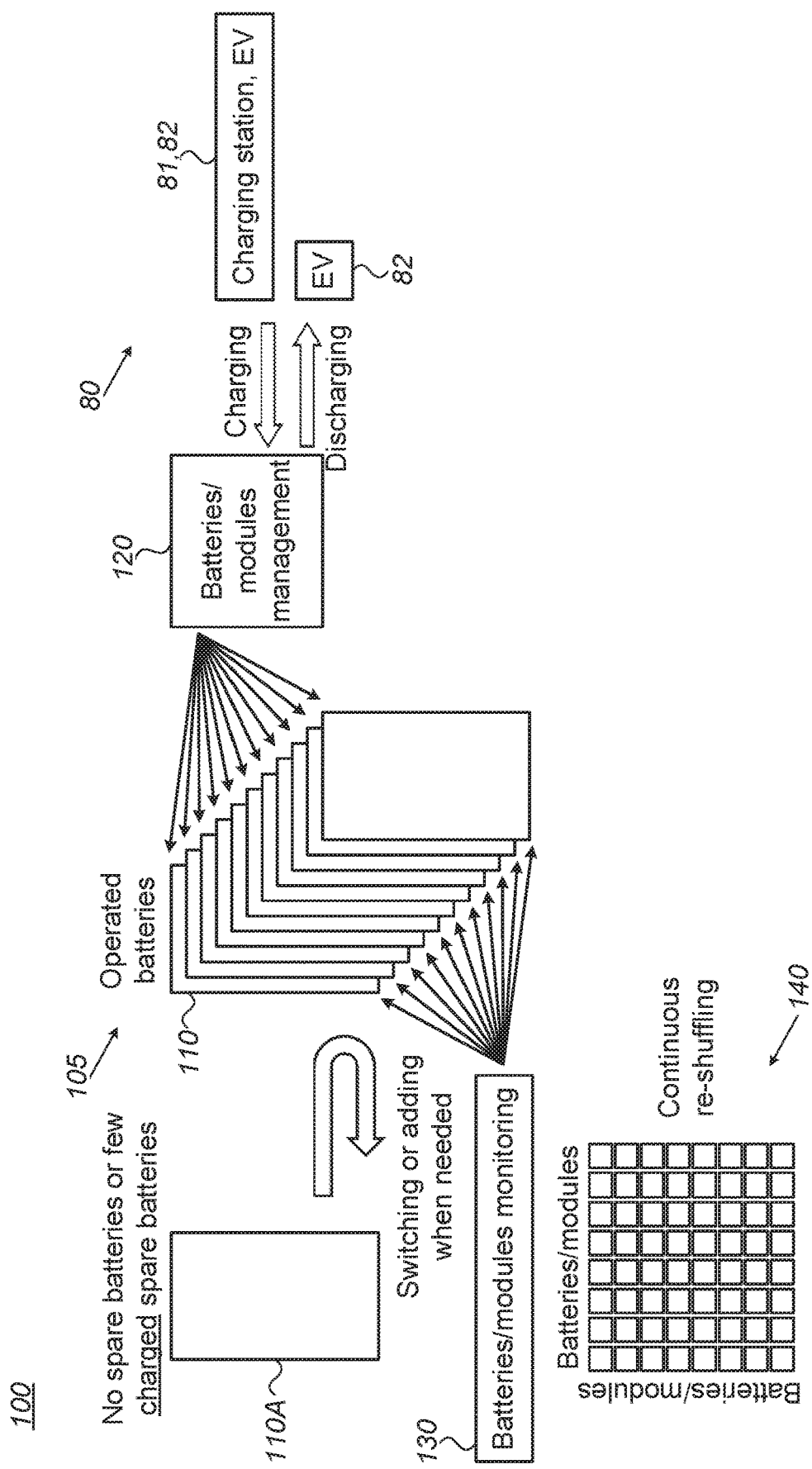
FIGS. 1 and 2 are high-level schematic illustrations of systems for optimizing usage of battery cells, according to some embodiments of the invention.

In the following description, various aspects of the present invention are described. For purposes of explanation, specific configurations and details are set forth in order to provide a thorough understanding of the present invention. However, it will also be apparent to one skilled in the art that the present invention may be practiced without the specific details presented herein. Furthermore, well known features may have been omitted or simplified in order not to obscure the present invention. With specific reference to the drawings, it is stressed that the particulars shown are by way of example and for purposes of illustrative discussion of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

Before at least one embodiment of the invention is explained in detail, it is to be understood that the invention is not limited in its application to the details of construction and the arrangement of the components set forth in the following description or illustrated in the drawings. The invention is applicable to other embodiments that may be practiced or carried out in various ways as well as to combinations of the disclosed embodiments. Also, it is to be understood that the phraseology and terminology employed herein are for the purpose of description and should not be regarded as limiting.

Unless specifically stated otherwise, as apparent from the following discussions, it is appreciated that throughout the specification discussions utilizing terms such as "processing", "computing", "calculating", "determining", "enhancing", "deriving" or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices. In certain embodiments, illumination technology may comprise, electromagnetic radiation in the visual range, ultraviolet or even shorter wave radiation such as x rays, and possibly even particle beams.

Embodiments of the present invention provide efficient and economical methods and mechanism for managing battery cells, especially for managing large numbers of cells, e.g., hundreds or thousands of cells, and thereby provide improvements to the technological field of energy storage devices and their applications, e.g., in electric vehicles. Methods and systems are provided for optimizing usage of a large number (e.g., hundreds, thousands or more) of battery cells, some, most or all of which fast charging cells, and possibly arranged in battery modules—e.g., for operating an electric vehicle power train. Methods comprise deriving an operation profile for the battery cells/modules for a specified operation scenario and specified optimization parameters, operating the battery cells/modules according to the derived operation profile, and monitoring the operation of the battery cells/modules and adjusting the operation profile correspondingly. Systems may be configured to balance cell/module parameters among modules, to have parallel supplemental modules and/or serial supplementary cells in the modules, and/or have supplemental modules and circuits configured to store excessive charging energy for cells groups and/or modules—to increase the cycling lifetime and possibly the efficiency of the systems. Advantageously, disclosed ways of redundancy management enhance the performance of the stack as a whole, with respect to delivered power, lifetime of the cells and performance of the associated power user, such as an electric vehicle.

Figure 2:
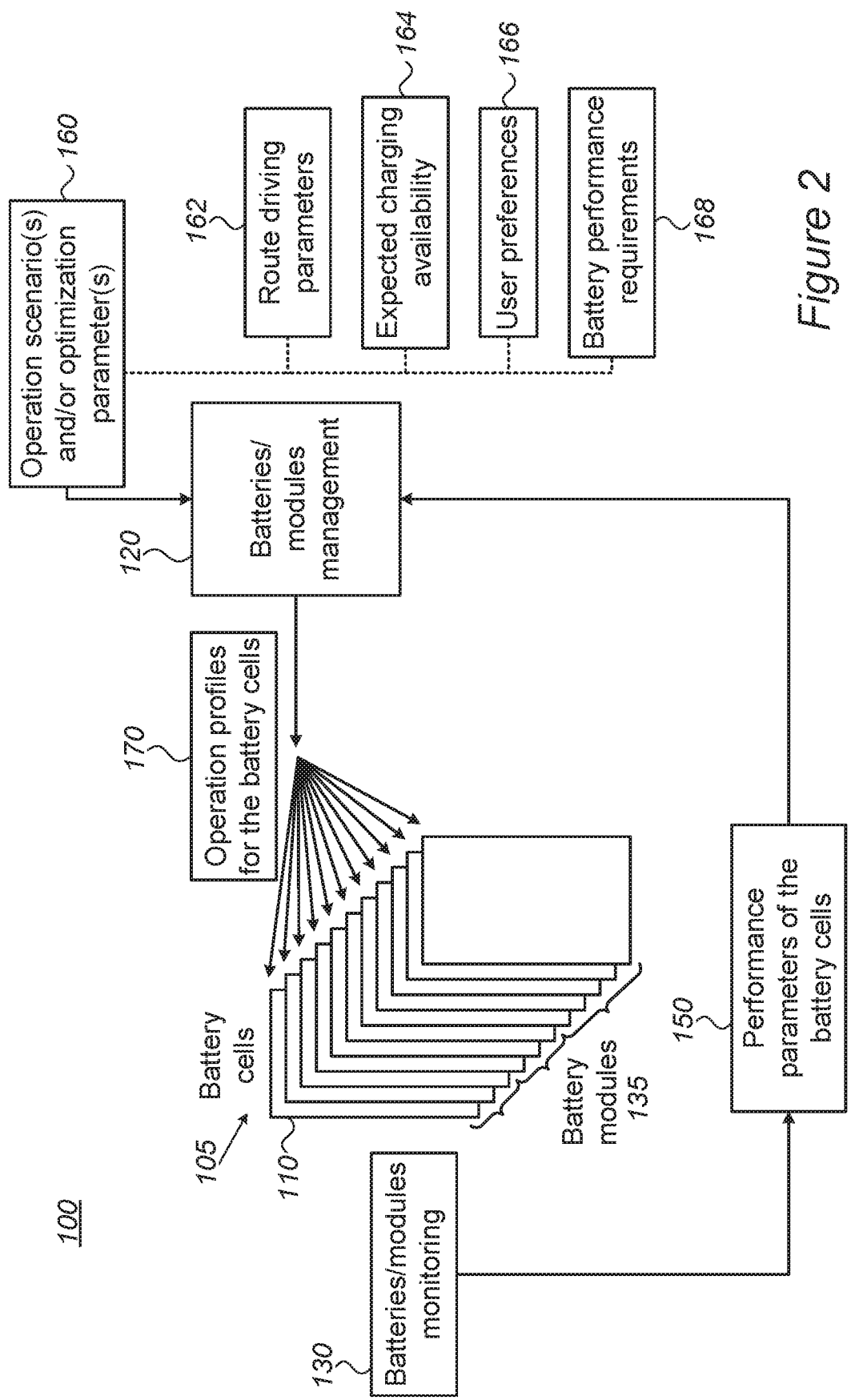

FIGS. 1 and 2 are high-level schematic illustrations of systems 100 for optimizing usage of battery cells, according to some embodiments of the invention. It is noted that systems 100 disclosed herein may be used for handling power delivery from and to various power systems such as electric vehicles, photovoltaic systems, solar systems, grid-scale battery energy storage systems, home energy storage systems and power walls. In the non-limiting example presented in FIGS. 1 and 2, an electric vehicle (EV) 82 is illustrated as representative for a corresponding power system.

It is noted that elements from FIGS. 1 and 2 may be combined in any operable combination, and the illustration of certain elements in certain figures and not in others merely serves an explanatory purpose and is non-limiting. Certain embodiments comprise an EV or any other power system having system 100 managing most or all battery cells thereof (with cells 110 representing the EV's and/or power system's power stack and management module 120 associated with the EV's and/or power system's control units).

System 100 comprises a plurality of battery cells 110 (as battery pack 105) at least some of which being fast charging cells, configured to be chargeable at least at 5C or 10C, and possibly being most or all batteries of EV 82. System 100 comprises a management module 120 configured to derive an operation profile 170 for battery cells 110 for a specified operation scenario and specified optimization parameters 160, and to operate battery cells 110 according to derived operation profile 170. System 100 further comprises, a monitoring module 130 associated with management module 120 (e.g., possibly part thereof, or in communication therewith) and configured to monitor the operation of battery cells 110 and adjust operation profile 170 correspondingly. The monitoring may be carried out with respect to one or more performance parameters 150 of cells 110 in battery pack 105, such as expected lifetime, state of health (SoH), state of charge (SoC), cell resistance, cell capacity, operation temperature, etc.

In various embodiments, the specified operation scenario may comprise, e.g., at least route driving parameters 162 and expected charging availability 164, and the specified optimization parameters may comprise user preferences 166 (e.g., driving behavior, required power, maximal trip length etc.) and battery performance requirements 168 such as, e.g., at least a lifetime of battery cells 110 with respect to specified criteria; e.g., with the operation of the battery cells being monitored with respect to the SoH and/or the expected lifetime of the battery cells.

In certain embodiments, management module 120 may be configured to group battery cells 110 into battery modules 135 of battery pack 105 (see FIG. 2) according to monitored battery parameters and to reduce intra-module cell variability with respect to inter-module cell variability (see below), and further configured to operate battery cells 110 group-wise with respect to battery modules 135. The grouping may be carried out to create a variability of battery cells 110 within battery modules 135 smaller than a variability between battery modules 135, with the variability being derived with respect to monitored battery parameters 150, e.g., with respect to expected lifetime, SoH, SoC, cell resistance, cell capacity, operation temperature, etc. For example, the variability may be derived with respect to SoH and/or expected lifetime of battery cells 110. Management module 120 may control the charging and discharging operations (denoted collectively by the numeral 80) with respect to charging stations 81 and EV 82—cell-wise and/or module-wise, according to derived operation profile 170.

Management module 120 may be further configured to re-group battery cells 110 into battery modules 135 within battery pack 105 upon changes in specified operation scenario and/or specified optimization parameters 160.

In certain embodiments, monitoring module 130 may be configured to carry out the monitoring of battery cells 110 (and/or modules 135) group-wise, to reduce a number of measurements from $O(n)$ to $O(\sqrt{n})$ or less, n denoting a number of battery cells 110. As illustrated schematically in FIG. 1, monitoring module 130 may be configured to manage simultaneous measurements and continuous re-shuffling of multiple cells 110 (represented schematically in FIG. 1 by a combinations matrix 140) to derive therefrom performance parameters 150 of cells 110 in significantly fewer measurement steps than measuring cells 110 one-by-one. For example, mathematical considerations suggest that the number of required measurements to provide monitoring of all cells 110 may be significantly reduce from prior art ca. n measurements to disclosed ca. $\sqrt{n}$ (possibly even to log n) measurements, saving much time and improving the monitoring efficiency, especially when handling hundreds or thousands of cells 110.

Figure 3:
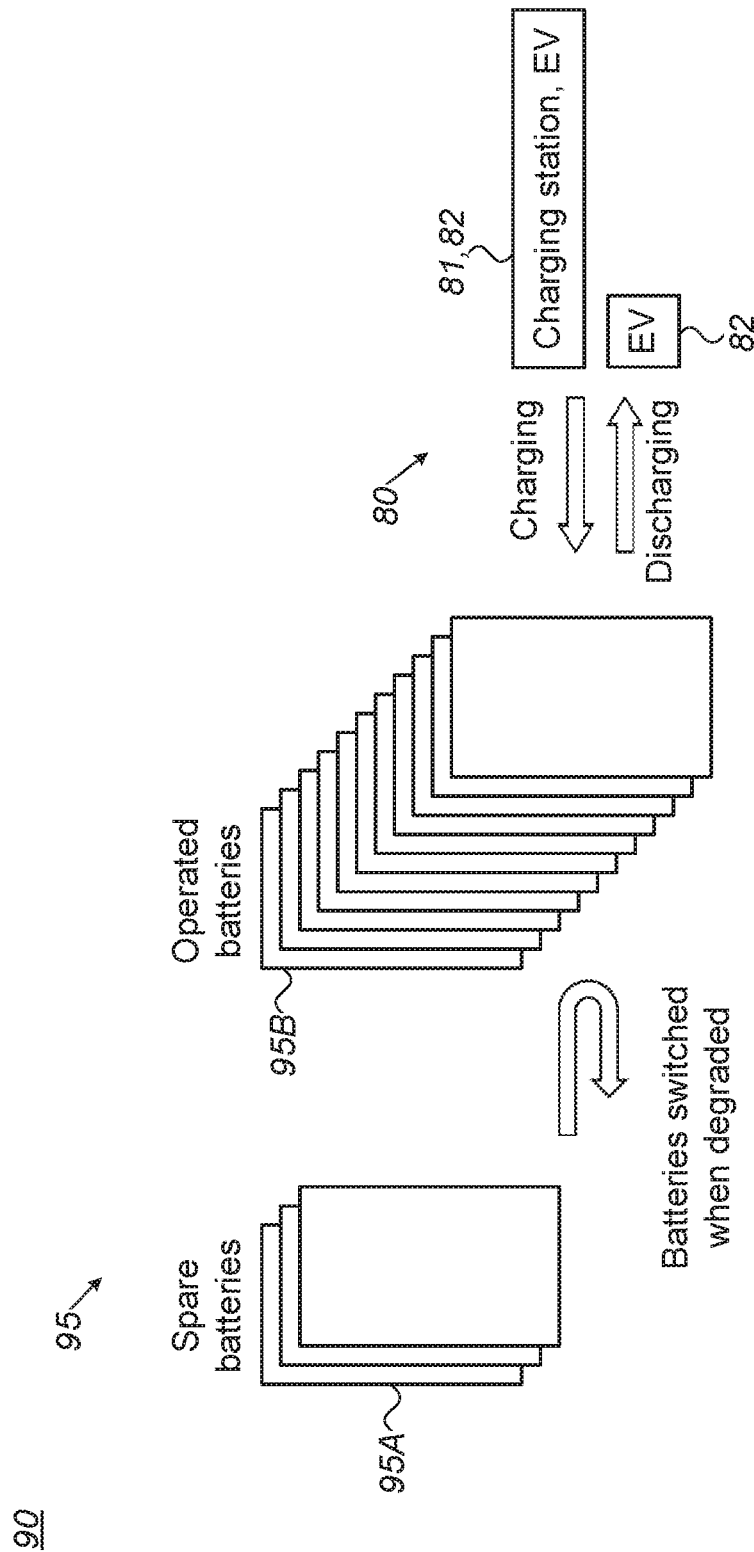
FIG. 3 is a high-level schematic illustration of prior art handling of EV battery cells.

FIG. 3 is a high-level schematic illustration of prior art handling 90 of EV battery cells 95. In the prior art, typically one set of batteries 95B is operated for charging and discharging 80 and another set of spare batteries 95A is used to replace degraded batteries (from set 95B) with fresh ones (from set 95A).

Advantageously, disclosed systems 100 are configured to operate all or most battery cells simultaneously (holding no, or fewer spare batteries), resulting in more uniform performance of battery cells 110 and greater ability to control degradation processes in battery cells 110 (such as the increase of their internal resistance), e.g., to maintain uniform degradation and more efficient and longer-lived operation of the power stack as a whole. In contrast, prior art operation of battery cells 95 results in highly non-uniform performance of battery cells 95 (as cells 95B are operated intensively while cells 95A are idle until replacement), possibly leading to quicker degradation of the older battery cells, enhancing the unevenness of battery performance. Moreover, systems 100 may be configured to handle battery cells individually, irrespectively of their physical inclusion in respective battery packs, and manage battery modules 135 in a virtual manner, irrespective of the physical location of the included battery cells 110. Such flexibility enhances the potential optimization and performance improvement provided by systems 100.

In contrast to the prior art, disclosed systems 100 may be configured to use the inherent redundancy in the number of battery cells 110 to reduce the depth of discharge of all battery cells 110 and to equalize their rates of degradation—increasing both overall lifetime and performance of the power stack. Certain embodiments provide improved redundancy management of battery cells 110 with respect to the prior art. For example, in some operation scenarios (e.g., maximal lifetime required), systems 100 may be configured to monitor the SoH of battery cells 110 and adjust the work load among cells 110 accordingly, e.g., to equalize as much as possible the SoH of battery cells 110. In other operation scenarios (e.g., maximal power required), both battery cells 110 with higher SoH and battery cells 110 with lower SoH may be operated intensively to provide required power, irrespective of the resulting uneven degradation.

In certain embodiments, operation of battery cells 110 may be planned in advance and adjusted during travel, e.g., to optimize the operation with respect to the expected loads, according to given expected (and/or previously travelled) route, with related driving parameters 162 such as distances, distances between charging stations, expected charging durations, slopes and curves on the route, etc. Certain groups 135 of cells may be planned to be operated along certain sections of the route, to optimize performance parameters of the EV and/or of the battery stack.

In certain embodiments, battery cells 110 may be operated to increase their cycling lifetime by reducing of the depth of discharge of cells 110, e.g., by including all battery cells 110 of EV 82 in the operation, rather than keeping some spare cells 95A as in the prior art. Moreover, battery cells 110 may be operated to have their states (e.g., SoC, SoH, etc.) more uniform across the whole battery stack, while optimizing their lifetime and system performance.

It is noted that possibly, in some embodiments, few spare cells 110A (see, e.g., FIG. 1) may be kept unused for emergency or for route section(s) requiring exceptionally large or long-lasting power supply (e.g., during steep climbs or when the distance between charging stations is exceptionally large). In such cases, system 100 comprises keeping spare cells 110A in a high charged state (e.g., 50%, 70%, 80% or more SoC, see FIG. 1), other than in the prior art which merely uses spare batteries 95A for replacement of malfunctioning batteries 95B, and therefore maintains spare batteries 95A at a low charging state. Charged spare batteries 110A may be charged in anticipation of such route sections which may require their use.

In the following, four approaches are presented for the monitoring and management of battery cells 110 in system 100, as may be implemented by management module 120 and/or associated monitoring module 130. It is noted that any operable combination of these approaches may be likewise implemented in system 100, simultaneously and/or sequentially, possible with respect to ongoing operation of system 100, the specified operation scenario, performance parameters 150, etc. It is further noted that the disclosed approaches may be implemented at cell and/or module level (e.g., battery cells 110 and battery modules 135, respectively), depending on the system configuration and the level of complexity of management module 120 and monitoring module 130.

Figure 4:
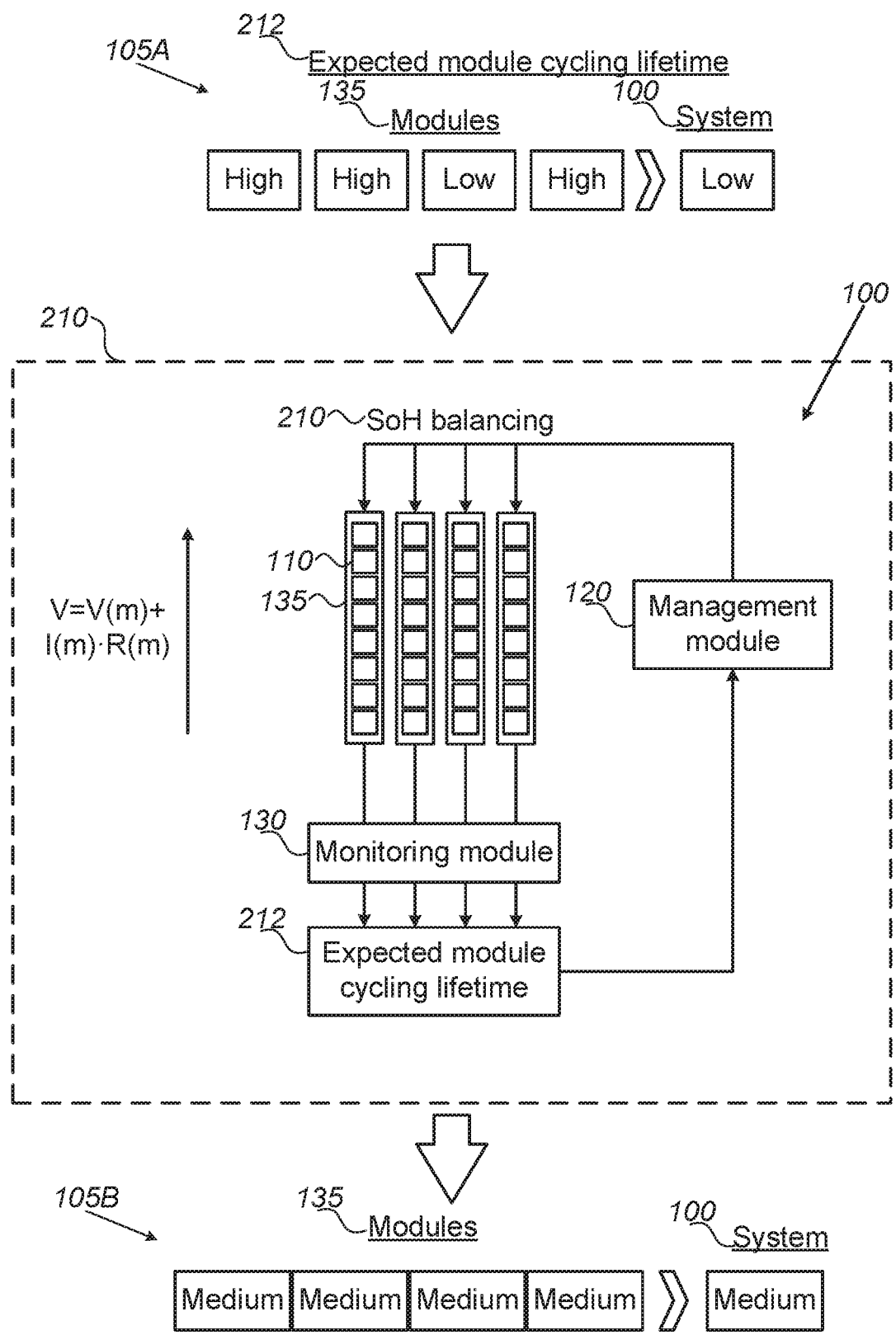
FIG. 4 is a high-level schematic illustration of SoH balancing in disclosed systems, according to some embodiments of the invention.

FIG. 4 is a high-level schematic illustration of SoH balancing 210 in system 100, according to some embodiments of the invention. Monitoring module 130 may be configured to monitor module parameters and estimate expected module cycling lifetimes 212, and management module 120 may be configured to balance module SoH 210 (illustrated schematically) as an example for optimization parameter 160, by adjusting any of charging currents, charging rates and/or charging times as components of operation profile 170 to balance the resulting cycling lifetimes of all modules 135.

For example, if one of the modules exhibits shortened cycling lifetime, the supplied charging currents, charging rates and/or charging times may be reduced to extend its cycling lifetime. To illustrate this point, the supplied voltage V equals the module voltage V(m) (equaling the number of cells times the cell voltage) plus the current through the module I(m) time the module resistance R(m). Once R(m) increases in a deteriorated module 135, I(m) is reduced and the overall voltage equal over all modules 135 is maintained, however, respective deteriorated module 135 with increased R(m) is charged to a lower SoC than other modules 135, due to the reduced current I(m) it receives. In certain embodiments, the differences in currents between deteriorated module 135 and other modules 135 may be enhanced (rather than balanced), to further decrease the current through deteriorated module 135 and increase the current through other modules 135. As a result, the cycling lifetime of deteriorated module 135 may be increased by operating it at lower current and lower SoC, while the cycling lifetime of other modules 135 may be decreased by operating them at higher current and higher SoC, while overall current supply form battery 100 is maintained as required. Consequently, cycling lifetimes are made more equal between deteriorated module 135 and other modules 135, resulting in an increased cycling lifetime of battery 100 as whole, as it depends on the cycling lifetime of the worst module 135. Management module 120 may be configured to rearrange cells 110 in modules 135 as disclosed, rearranging at least some of cells 110 and/or modules 135 in battery pack 105, e.g., from one configuration 105A to another configuration 105B (denoted schematically), as explained above.

It is noted than such adjustment requires increasing any of the supplied charging currents, charging rates and/or charging times to the other modules—thereby reducing their cycling lifetime—to ensure continued performance of system 100. Operation profile 170 of modules 135 may therefore be adjusted to equalize the cycling lifetime of all modules, thereby increasing the cycling lifetime of system 100 as a whole, as illustrated schematically in FIG. 4. As the cycling lifetime of system 100 is limited by the module having the worst cycling lifetime, balancing modules 135 yields system 100 with longer cycling lifetime. For example, if three of four modules have estimated cycling lifetime 212 of 1000 cycles, while one module deteriorates after 500 cycles—it would yield a cycling lifetime of 500 cycles for system 100 as a whole, balancing SoH 210 may result in equalized cycling lifetimes of ca. 900 cycles for all modules (by relieving the deteriorated module and overloading the other modules), yielding a cycling lifetime of 900 cycles for system 100.

Figure 5:
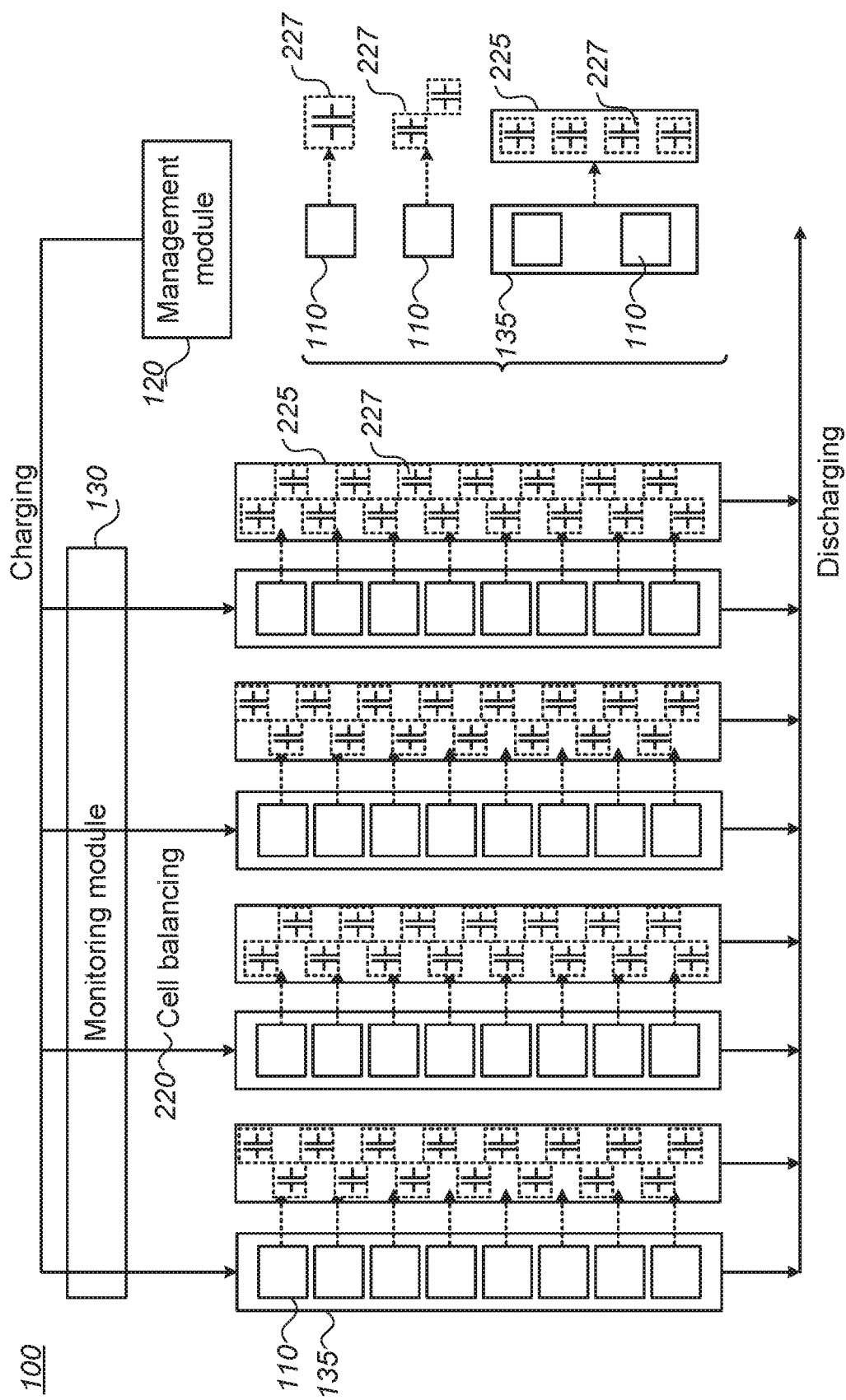
FIG. 5 is a high-level schematic illustration of cell balancing in disclosed systems, according to some embodiments of the invention.

FIG. 5 is a high-level schematic illustration of cell balancing 220 in system 100, according to some embodiments of the invention. Cell balancing 220 may be carried out by redirecting surplus charging to supplemental modules 225, such as modules 225 with supercapacitors (SC) 227 and/or supercapacitor-emulating fast charging batteries (SCeFCB) 227 disclosed in U.S. Pat. No. 10,110,036, incorporated herein by reference in its entirety. Various types of supplemental modules 225 and associated circuits may be used, such as passive circuits that merely dissipate excessive charging energy (e.g., resistor bridges), or active circuits that store the excessive energy in, e.g., capacitors. Cell balancing 220 may be carried out on a cell by cell basis, either by monitoring module 130 and/or management module 120, or at least partly by the circuit configuration; and/or cell balancing 220 may be carried out on groups of cells 110 or possible on modules 135, either by monitoring module 130 and/or management module 120, or at least partly by the circuit configuration. It is noted that in any of the configurations, cell balancing 220 results in cells 110 with more uniform operation profile 170 and consequently more uniform cell parameters such as SoH, SoC and cycling lifetime. Moreover, active balancing advantageously may further use charged supplemental modules 225 during discharging to provide the excessively charged energy as usable energy.

In various embodiments, individual cells 110 may be balanced with corresponding one or more SC/SCeFCB 227 and/or modules 135 may be balanced with corresponding modules 225 having multiple SC/SCeFCBs 227, as illustrated schematically in FIG. 5. In case of cell-by-cell balancing, SC/SCeFCB 227 have the same voltage as cell 110. In case of module-level balancing, supplemental modules 225 have the same voltage as modules 135. However, individual SC/SCeFCB 227 may have lower voltage than individual cell 110, as SC/SCeFCBs 227 are supplemental and are not charged as much as cells 110. Therefore, supplemental modules 225 may have more and smaller SC/SCeFCBs 227 than modules 135 have cells 110. In certain embodiments, monitoring module 130 and/or management module 120 may be configured to predict cell and/or module behavior, e.g., with respect to their monitored resistance and/or charge development during charging, and supplemental modules 225 and/or SC/SCeFCBs 227 may be charged before modules 135 and/or cells 110 are fully charged, to balance them in advance and during operation.

In certain embodiments, discharging profiles of modules 135 and supplemental modules 225 may differ, e.g., supplemental modules 225 (e.g., including SC/SCeFCBs 227) may be used as high-power module(s), while modules 135 may be used as high-energy modules, e.g., as disclosed (as SCeFC and FC modules, respectively) in U.S. Patent Application Publication No. 20180050602, incorporated herein by reference in its entirety. In certain embodiments, supplemental modules 225 may be charged with respect to their SoH.

Figure 6:
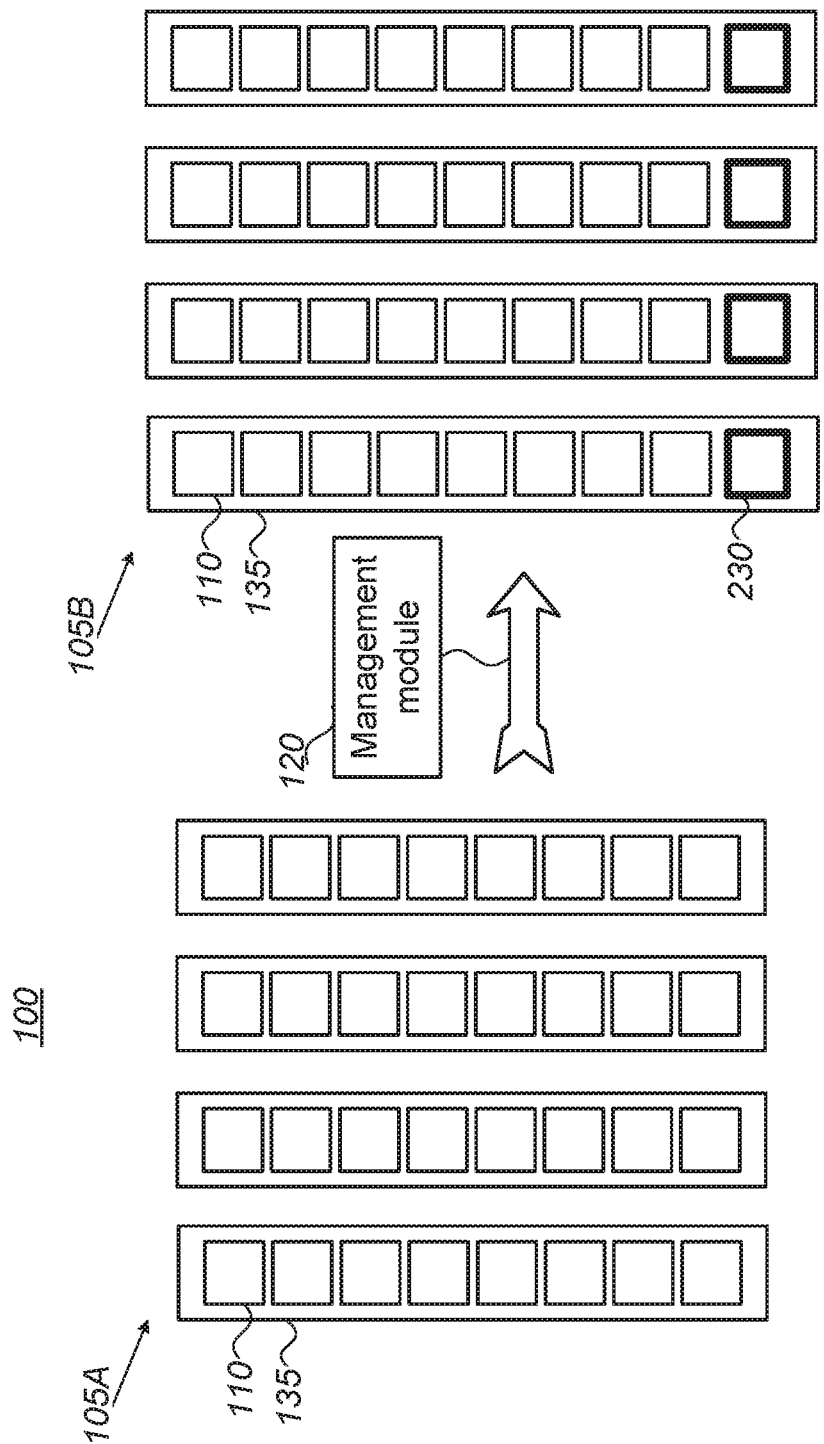
FIG. 6 is a high-level schematic illustration of systems with supplementary cells, according to some embodiments of the invention

FIG. 6 is a high-level schematic illustration of system 100 with supplementary cells 230, according to some embodiments of the invention. One or more supplementary cells 230 may be incorporated in modules 135, beyond the required module capacity, to enable operation of cells 110 at lower intensity than the specified operation scenario, e.g., operation profile 170 for battery cells 110 may comprise lower charging rate than specified—thereby increasing the cycling lifetime of cells 110 and system 100, and reducing the sensitivity to cell deficiencies. In certain embodiments, operation profile 170 may comprise lower maximal SoC and/or smaller DoD (depth of discharge) than specified in configurations than enable such profiles 170 with respect to the type of electric connections of supplementary cells 230, e.g., in series and/or in parallel to cells 110 and/or modules 135.

Supplementary cells 230 may have (at least approximately) the same voltage as cells 110 to which they are serially connected in respective module 135. In certain embodiments, supplementary cells 230 may have (at least approximately) the same capacity as cells 110 to which they are serially connected in respective module 135, with acceptable variation due to the respective SoC and the respective sensitivity to overvoltage.

Disclosed solutions may be particularly adapted for simpler management modules 120, which handle modules 135 as wholes, without monitoring of, or influence on cells 110 or groups of cells 110 within modules 135. Supplementary cells 230, connected serially to cells 110, therefore provide inherent and internal robustness with respect to malfunction of individual cells 110, and are advantageous with respect to prior art (such as illustrated in FIG. 3) as robustness is built into modules 135, with supplementary cells 230 operating with cells 110.

Management module 120 may be configured to add supplementary cells 230 to modules 135 as disclosed, modifying battery pack 105, e.g., from one configuration 105A to another configuration 105B (denoted schematically), as explained above.

In various embodiments, supplementary cells 230 may be fast charging cells, which may be charged and/or and discharged at high C rates, e.g., 10C or several tens of C. Supplementary cells 230 may have a lower capacity than other cells 110, yet be configured to still handle the original system currents flowing through cells 110 due to their high C rate capabilities.

Figure 7:
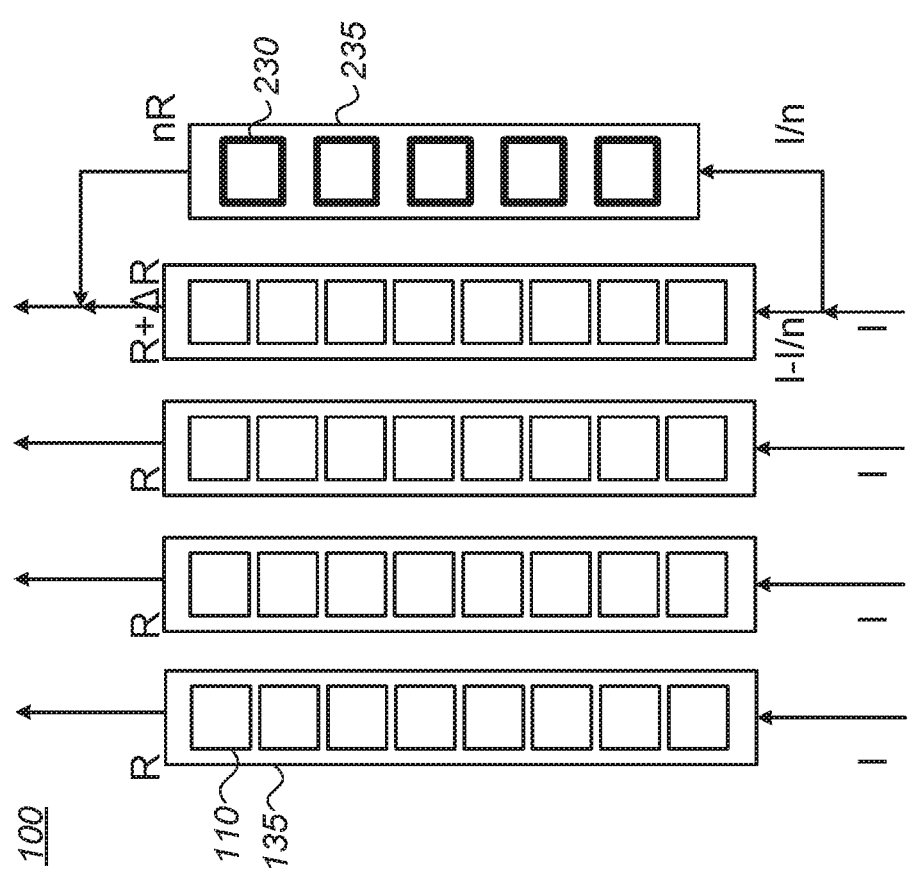
FIG. 7 is a high-level schematic illustration of systems with supplementary cell module(s), according to some embodiments of the invention.

FIG. 7 is a high-level schematic illustration of system 100 with supplementary cell module(s) 235, according to some embodiments of the invention. One or more modules 235 with supplementary cells 230 may be included in system 100, beyond the required system capacity, to provide compensation for increasing resistance of one (or more) defective module. In particular, when modules 135 comprise high capacity cell(s) 110, adding cell 230 to each module 135 as illustrated in FIG. 6 may be more than required, as most modules 135 are expected to operate properly. When cells 110 have a large capacity, supplementary module 235 may comprise cells 230 having a small capacity, e.g. 1/n of the capacity of cells 110, with corresponding higher module resistance, e.g., n·R of the resistance R of modules 135. If one module 135 deteriorates and its resistance increases, e.g., to R+ΔR, parallel connection of supplementary module 235 to it reduces back the resistance of the compound circuit branch made of modules 135, 235 with resistance values of R+ΔR and n·R, respectively, and reduces the load on deteriorated module 135 by reducing the current flowing through it (e.g., from I to I−I/n, with I/n diverted to flow through supplementary module 235). The capacity of supplementary module 235 (as well as the number of cells 230, their resistance etc.) may be derived from the requirement defining the allowed decline in current during charging of system 100. For example, if allowed current decline (I/n) is 10%, n would be 10 and supplementary module 235 may be configured to be charged by currents of I/n and have a resistance n·R. It is noted that disclosed embodiments not only balance among modules 135 with respect to their operational parameters, but also provide more stored energy, as the charge stored in supplementary module 235 is usable and not wasted as heat.

Certain embodiments comprise operating supplementary module 235 as a high-power module e.g., as disclosed (as SCeFC modules) in U.S. Patent Application Publication No. 20180050602, incorporated herein by reference in its entirety, with supplementary module 235 and modules 135 (usable collectively as the FC module taught by U.S. Patent Application Publication No. 20180050602) being balanced as well. Currents and possibly voltages of supplementary module(s) 235 may be adjusted with respect to one or more of modules 135, to enable increasing currents provided to and/or delivered by supplementary module(s) 235, and/or to enable using cells 230 with smaller capacity than cells 110.

In certain embodiments, operation profile 170 may comprise lower maximal SoC and/or smaller DoD (depth of discharge) than specified in configurations that enable such profiles 170 with respect to the type of electric connections of cells 230 in supplementary modules 235, e.g., in series and/or in parallel to cells 110 and/or modules 135.

Supplementary module(s) 235 provide flexible and external robustness, especially with respect to malfunction of large-capacity cells 110, and are advantageous with respect to prior art (such as illustrated in FIG. 3) as smaller cells 230 may be used for backing large cells 110, with supplementary module(s) 235 configurable according to the performance requirements for system 100.

Figure 8A:
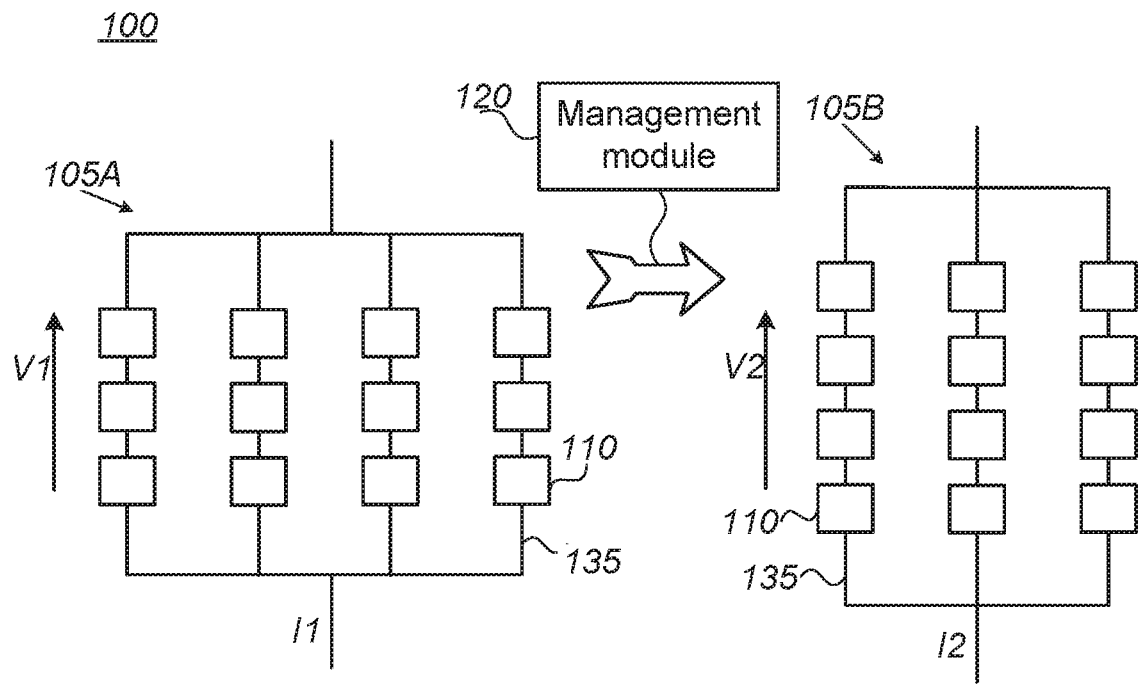
FIGS. 8A and 8B are high-level schematic illustrations of systems and management modules configured to re-arrange the cells in modules, according to some embodiments of the invention.
Figure 8B:
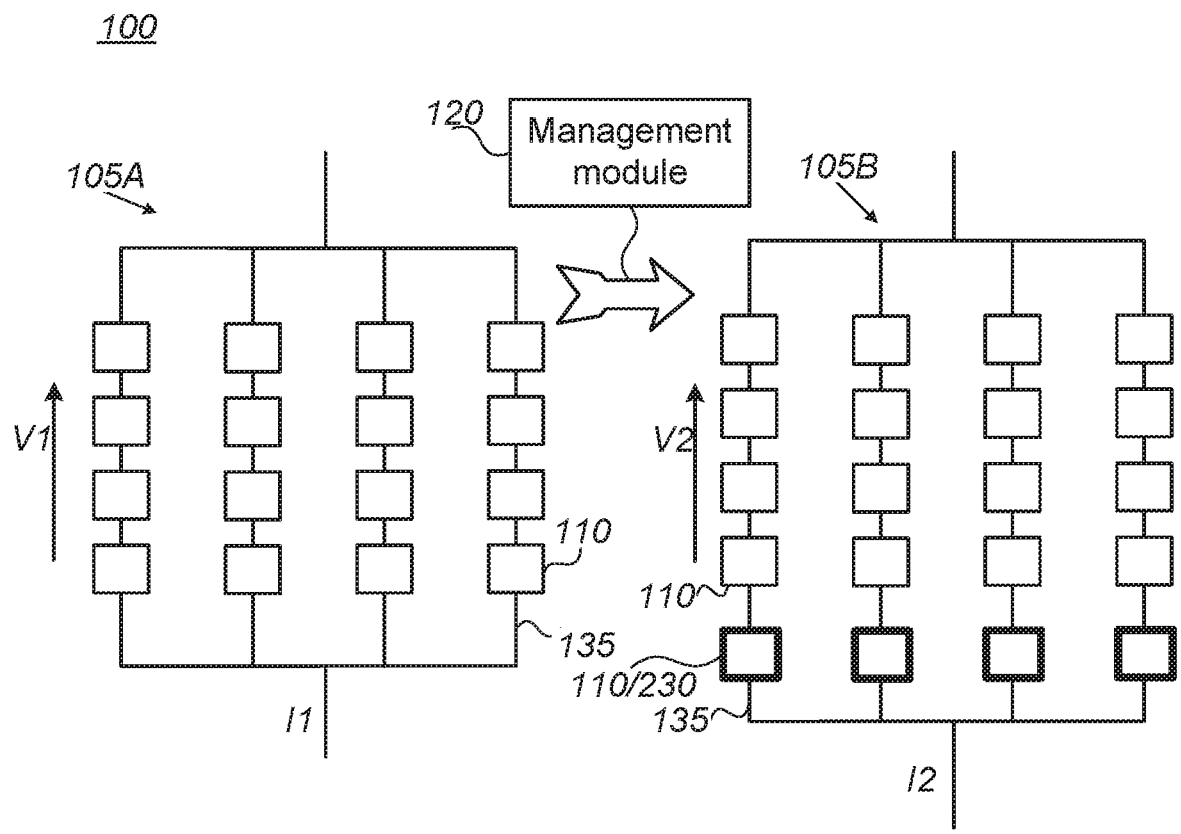

FIGS. 8A and 8B are high-level schematic illustrations of systems 100 and management modules 120 configured to re-arrange cells 110 in modules 135, according to some embodiments of the invention. In certain embodiments, management module 120 may be configured to re-arrange cells 110 and/or use supplementary cells 230 to adjust the operating battery modules 135 at a low-voltage cutoff region. During the operation of battery cells 110 and modules 135, the voltage is correlated to the total SoC of the battery in system 100. In many applications, the load (not shown) requires a specific voltage range which limits the operation of the battery pack and system 100, especially when using cells 100 which have metalloid-based chemistry (e.g., having anodes with Si, Ge and/or Sn-based anode material) that have a wider voltage window and a lower cutoff voltage than graphite-based or other cell chemistries. Management module 120 may be configured to modify the arrangement of cells 110 in modules 135 to prevent prior art disconnection of the battery from the load when reaching the lower cutoff voltage, which may typically be carried out before the battery reaches the lower cutoff voltage in order to have margin capacity and not deplete completely the pack. In certain embodiments, Management module 120 may be configured to maintain the battery's operation profile by rearranging battery cells 110 to increase the voltage by connecting more cells 110 serially in modules 135 to increase the overall battery voltage to the higher level of the allowed voltage range and gain more operation time for the load. For example, in the schematic non-limiting illustration of FIG. 8A, one configuration 105A comprising three cells 110 per module 135 providing a voltage range V1 between 9-12.9V (single cell voltage range being between 3V and 4.3V) and a corresponding total current I1, may be rearranged into another configuration 105B comprising four cells 110 per module 135 providing a voltage range V2 between 9-12V (for discharged and/or deteriorated single cells having reduced voltage ranges between 2.25V and 4V) and a corresponding lower total current I2<I1. It is noted that the schematic illustration merely provides the operation principles for rearranging cells 110 in modules 135 by management module 120. Similar principles may be applied to any part or whole of battery pack 105 according to performance requirements. The re-arrangement of cells 110 may be configured to provide a tradeoff between the operation time and the load performance, as once the re-arrangement (105A→105B) is performed, the time of operation is prolonged as the battery can support the reduced current at the same voltage. For example, such operation profile may be used to implement an emergency case while driving an EV—once the powertrain reaches the lower voltage cutoff, management module 120 may rearrange cells 110 and/or modules 135 to increase the voltage and gain more driving time, at the price of limiting the power and/or performance of the EV, e.g., by implementing an economic mode of operation and extending the driving range.

In certain embodiments, illustrated schematically in FIG. 8B, rearranged cells 110 and/or supplementary cells 230 may be used to extend the operation range and/or increase the operation time of the load by keeping the powertrain in the desired voltage range without compromising on performance. For example, in the schematic non-limiting illustration of FIG. 8B, one configuration 105A comprising four cells 110 per module 135 providing a voltage range V1 between 12-17.2V (single cell voltage range being between 3V and 4.3V) and a corresponding total current I1, may be rearranged into another configuration 105B comprising five cells 110 (and/or supplementary cells 230) per module 135 providing a voltage range V2 between 12-16.3V (for four discharged and/or deteriorated cells having reduced voltage ranges between 2.25V and 3V and one supplementary cell 230 having a voltage range between 3V and 4.3V) and a corresponding lower total current I2<I1. Clearly, the schematic illustration provides the operation principles for rearranging cells 110 and/or supplementary cells 230 in modules 135 by management module 120, which may be applied to any part and/or while of battery pack 105 according to performance requirements.

In various embodiments, consequentially, the lower voltage cutoff that characterizes metalloid-based cells (or cells with another technology that can reach lower cutoff voltages) may be utilized while keeping the overall system voltage at the desired operational range for a longer period of use.

Figure 9:
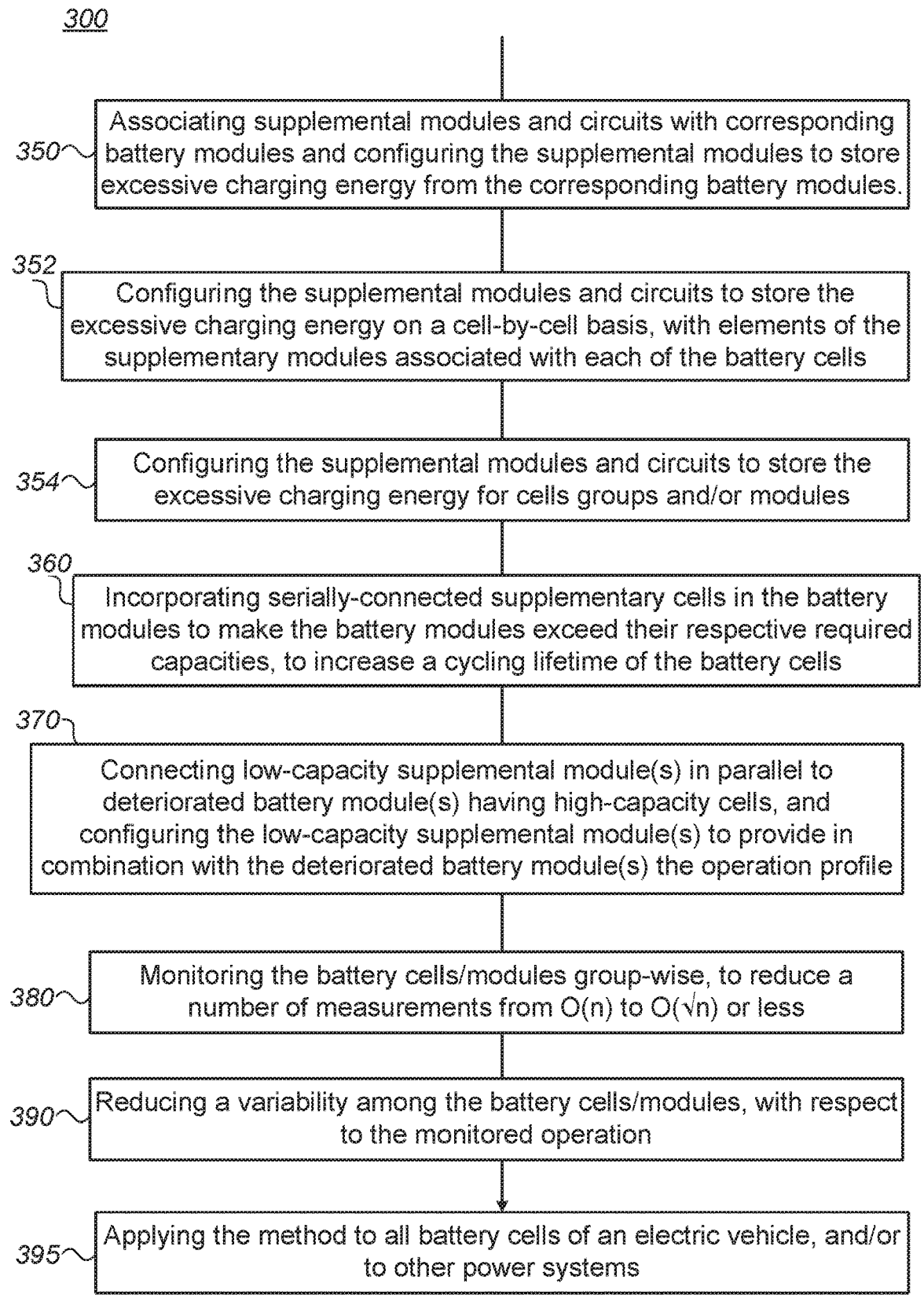
FIG. 9 is a high-level flowchart illustrating methods, according to some embodiments of the invention.

FIG. 9 is a high-level flowchart illustrating a method 300, according to some embodiments of the invention. The method stages may be carried out with respect to systems 100 described above, which may optionally be configured to implement method 300. Method 300 may be at least partially implemented by at least one computer processor, e.g., in battery management module 120. Certain embodiments comprise computer program products comprising a computer readable storage medium having computer readable program embodied therewith and configured to carry out the relevant stages of method 300. Method 300 may comprise the following stages, irrespective of their order.

Method 300 comprises optimizing usage of a plurality of battery cells and/or battery modules (stage 302), wherein at least some of the battery cells are fast charging cells, configured to be chargeable at least at 5C. Method 300 may comprise grouping the battery cells into battery modules according to monitored battery parameters and carrying out the operation of the battery cells group-wise with respect to the battery modules (stage 304). For example, grouping of the cells into modules may be carried out to make a variability of the battery cells within the battery modules smaller than a variability between the battery modules, with the variability being derived with respect to the monitored battery parameters (stage 306), e.g., with respect to expected lifetime, SoH, cell resistance, cell capacity, operation temperature, etc. For example, the variability may be derived with respect to SoH and/or expected lifetime of the battery cells. Method 300 may further comprise re-grouping the battery cells into battery modules upon changes in the specified operation scenario and/or the specified optimization parameters (stage 308). Alternatively or complementarily, re-grouping 308 may be carried out periodically to adjust grouping 304 to changing battery cell parameters, and/or upon detection of specified changes in the battery cell parameters.

Method 300 may comprise deriving an operation profile for the battery modules for a specified operation scenario and specified optimization parameters (stage 310), operating the battery modules according to the derived operation profile (stage 320), and monitoring the operation of the battery modules and adjusting the operation profile correspondingly (stage 330). Any of the stages of deriving 310, operating 320 and monitoring and adjusting 330 may be carried out at least partly by one or more computer processors, as are any of the following stages. For example, the specified operation scenario may comprise at least route driving parameters and expected charging availability. For example, the specified optimization parameters may comprise at least a lifetime of the plurality of battery cells with respect to specified criteria. In certain embodiments, optimization 302 may comprise reducing or minimizing the depth of discharge of the battery cells in order to increase their lifetime. For example, the operation of the battery cells may be monitored with respect to a state of health (SoH) of the battery cells.

In certain embodiments, method 300 may comprise monitoring battery module parameters, estimating expected module cycling lifetimes, and balancing module SoH as a specified optimization parameter, by adjusting any of charging currents, charging rates and/or charging times as components of the operation profile to balance resulting cycling lifetimes of all the modules (stage 340). Method 300 may further comprise increasing the cycling lifetime of at least one deteriorated module by reducing the cycling lifetime of at least one other operable module, to balance the cycling lifetimes over all modules (stage 345).

In certain embodiments, method 300 may comprise associating a plurality of supplemental modules and circuits associated with corresponding battery modules, and configuring the supplemental modules to store excessive charging energy from the corresponding battery modules (stage 350). Method 300 may further comprise configuring the supplemental modules and circuits to store the excessive charging energy on a cell-by-cell basis, with elements of the supplementary modules associated with each of the battery cells (stage 352). Alternatively or complementarily, method 300 may further comprise configuring the supplemental modules and circuits to store the excessive charging energy for cells groups and/or modules (stage 354).

In certain embodiments, method 300 may comprise incorporating serially-connected supplementary cells in the battery modules to make the battery modules exceed their respective required capacities, to increase a cycling lifetime of the battery cells (stage 360).

In certain embodiments, the battery cells are high-capacity cells and method 300 may comprise connecting at least one low-capacity supplemental module in parallel to at least one deteriorated battery module, and configuring the at least one low-capacity supplemental module to provide in combination with the at least one deteriorated battery module the operation profile (stage 370).

In certain embodiments, monitoring of the battery cells and/or modules may be carried out group-wise, to reduce a number of measurements from $O(n)$ to $O(\sqrt{n})$ or less (stage 380), n denoting a number of the battery cells.

In certain embodiments, method 300 may further comprise deriving the operation profile to reduce a variability among the battery cells and/or modules, with respect to the monitored operation, and/or reducing said variability (stage 390). The variability may be defined with respect to one or more battery cell/module parameter, such as the expected lifetimes of the corresponding battery cells/modules, and the operation of the battery cells/modules may be monitored with respect to the defined variability.

In certain embodiments, method 300 may be applied to all battery cells of an electric vehicle (EV) and/or to other power systems (stage 395), providing a novel and effective redundancy management of the battery cells of the EV. It is noted that methods 300 disclosed herein may be used for handling power delivery from and to various power systems such as electric vehicles, photovoltaic systems, solar systems, grid-scale battery energy storage systems, home energy storage systems and power walls. Any of the disclosed embodiments may be likewise applied to any of photovoltaic systems, solar systems, grid-scale battery energy storage systems, home energy storage systems and power walls. Corresponding adjustments comprise energy production profiles of respective power systems to replace incoming energy from the electric vehicle and energy consumption profiles of respective power systems to replace energy requirements of the electric vehicle.

In any of the disclosed embodiments, at least some of the cells may be fast charging cells, which may be charged at rates higher than 5C, e.g., 10C, 30C or 100C (with C denoting the rate of charging and/or discharging of cell/battery capacity, e.g., 10C denotes charging and/or discharging the full cell capacity in $\frac{1}{10}$ of an hour). Fast charging cells may comprise rechargeable Li-ion cells having anode material based on metalloids such as Si, Ge and/or Sn, as taught e.g., by any of U.S. Pat. Nos. 9,472,804, 10,096,859 and 10,199,677, and U.S. Patent Publication Nos. 2017/0294687 and -2018-0212236, which are incorporated herein by reference in their entirety.

Elements from FIGS. 1-9 may be combined in any operable combination, and the illustration of certain elements in certain figures and not in others merely serves an explanatory purpose and is non-limiting. Aspects of the present invention are described above with reference to flowchart illustrations and/or portion diagrams of methods, apparatus (systems) and computer program products according to embodiments of the invention. It will be understood that each portion of the flowchart illustrations and/or portion diagrams, and combinations of portions in the flowchart illustrations and/or portion diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or portion diagram or portions thereof.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or portion diagram or portions thereof.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or portion diagram or portions thereof.

The aforementioned flowchart and diagrams illustrate the architecture, functionality, and operation of possible implementations of systems, methods and computer program products according to various embodiments of the present invention. In this regard, each portion in the flowchart or portion diagrams may represent a module, segment, or portion of code, which comprises one or more executable instructions for implementing the specified logical function(s). It should also be noted that, in some alternative implementations, the functions noted in the portion may occur out of the order noted in the figures. For example, two portions shown in succession may, in fact, be executed substantially concurrently, or the portions may sometimes be executed in the reverse order, depending upon the functionality involved. It will also be noted that each portion of the portion diagrams and/or flowchart illustration, and combinations of portions in the portion diagrams and/or flowchart illustration, can be implemented by special purpose hardware-based systems that perform the specified functions or acts, or combinations of special purpose hardware and computer instructions.

In the above description, an embodiment is an example or implementation of the invention. The various appearances of "one embodiment", "an embodiment", "certain embodiments" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention may also be implemented in a single embodiment. Certain embodiments of the invention may include features from different embodiments disclosed above, and certain embodiments may incorporate elements from other embodiments disclosed above. The disclosure of elements of the invention in the context of a specific embodiment is not to be taken as limiting their use in the specific embodiment alone. Furthermore, it is to be understood that the invention can be carried out or practiced in various ways and that the invention can be implemented in certain embodiments other than the ones outlined in the description above.

The invention is not limited to those diagrams or to the corresponding descriptions. For example, flow need not move through each illustrated box or state, or in exactly the same order as illustrated and described. Meanings of technical and scientific terms used herein are to be commonly understood as by one of ordinary skill in the art to which the invention belongs, unless otherwise defined. While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

What is claimed is:

1. A method of optimizing usage of a plurality of battery cells arranged in battery modules, wherein at least some of the battery cells are fast charging cells, configured to be chargeable at least at 5C, the method comprising:
    deriving an operation profile for the battery modules for a specified operation scenario and specified optimization parameters,
    operating the battery modules according to the derived operation profile, and monitoring the operation of the battery modules and adjusting the operation profile correspondingly; wherein the monitoring comprises performing multiple group-wise measurements of continuously re-shuffled groups of battery modules, and deriving, from the multiple group-wise measurements, performance parameters of single battery modules of the re-shuffled groups of battery cells.

2. The method of claim 1, further comprising:
   monitoring battery module parameters,
   estimating expected module cycling lifetimes, and
   balancing module state of health (SoH) as a specified optimization parameter, by adjusting any of charging currents, charging rates and/or charging times as components of the operation profile to balance resulting cycling lifetimes of all the modules.

3. The method of claim 2, further comprising: increasing the cycling lifetime of at least one deteriorated module by reducing the cycling lifetime of at least one other operable module, to balance the cycling lifetimes over all modules.

4. The method of claim 1, further comprising: associating a plurality of supplemental modules and circuits associated with corresponding battery modules, configuring the supplemental modules to store excessive charging energy from the corresponding battery modules.

5. The method of claim 4, further comprising configuring the supplemental modules and circuits to store the excessive charging energy on a cell-by-cell basis, with elements of the supplementary modules associated with each of the battery cells.

6. The method of claim 4, further comprising configuring the supplemental modules and circuits to store the excessive charging energy for cells groups and/or modules.

7. The method of claim 1, further comprising: incorporating serially-connected supplementary cells in the battery modules to make the battery modules exceed their respective required capacities, to increase a cycling lifetime of the battery cells.

8. The method of claim 1, wherein the battery cells are high-capacity cells and method further comprises connecting at least one low-capacity supplemental module in parallel to at least one deteriorated battery module, and configuring the at least one low-capacity supplemental module to provide, in combination with the at least one deteriorated battery module, the operation profile.

9. The method of claim 1, wherein the specified operation scenario comprises at least route driving parameters and expected charging availability; the specified optimization parameters comprise at least a lifetime of the plurality of battery cells and/or modules with respect to specified criteria; and the operation profile is derived to reduce a variability among the battery cells, with respect to the monitored operation.

10. The method of claim 1, wherein the battery cells are grouped into the battery modules according to monitored battery parameters to make a variability of the battery cells within the battery modules smaller than a variability between the battery modules, with the variability being derived with respect to the monitored battery parameters.

11. The method of claim 10, further comprising re-grouping the battery cells into battery modules upon changes in the specified operation scenario and/or the specified optimization parameters.

12. The method of claim 1, wherein the performing of the multiple group-wise measurements reduces a number of measurements from $O(n)$ to $O(\sqrt{n})$ or less, n denoting a number of the battery cells.

13. A system comprising:
a plurality of battery cells, at least some of which being fast charging cells, configured to be chargeable at least at 5C, wherein the battery cells are arranged in battery modules, connected in parallel,
a management module configured to derive an operation profile for the battery modules for a specified operation scenario and specified optimization parameters, and to operate the battery modules according to the derived operation profile, and
a monitoring module associated with the management module and configured to:
(a) monitor the operation of the battery modules by performing multiple group-wise measurements of continuously re-shuffled groups of battery modules, and deriving, from the multiple group-wise measurements, performance parameters of single battery modules of the re-shuffled groups of battery cells, and
(b) adjust the operation profile correspondingly.

14. The system of claim 13, wherein the monitoring module is configured to monitor module parameters and estimate expected module cycling lifetimes, and the management module is configured to balance module state of health (SoH) as a specified optimization parameter, by adjusting any of charging currents, charging rates and/or charging times as components of the operation profile to balance a resulting cycling lifetimes of all the modules.

15. The system of claim 14, wherein the management module is further configured to increase the cycling lifetime of at least one deteriorated module by reducing the cycling lifetime of at least one other operable module, to balance the cycling lifetimes over all modules.

16. The system of claim 13, further comprising a plurality of supplemental modules and circuits correspondingly associated with the battery modules and configured to store excessive charging energy from the corresponding battery modules.

17. The system of claim 16, wherein the supplemental modules and circuits are configured to store the excessive charging energy on a cell-by-cell basis, with elements of the supplementary modules associated with each of the battery cells.

18. The system of claim 17, wherein the elements of the supplementary modules are capacitors.

19. The system of claim 16, wherein the supplemental modules and circuits are configured to store the excessive charging energy for cells groups and/or modules.

20. The system of claim 13, wherein the battery modules comprise supplementary cells connected serially to the battery cells in the respective battery module, the supplementary cells making the battery modules exceed their respective required capacities, to increase a cycling lifetime of the battery cells.

21. The system of claim 13, wherein the battery cells are high-capacity cells and the system further comprises at least one low-capacity supplemental module connected in parallel to at least one deteriorated battery module, and configured to provide in combination the required operation profile.

22. The system of claim 13, wherein the specified operation scenario comprises at least route driving parameters and expected charging availability, the specified optimization parameters comprise at least a lifetime of the plurality of battery cells with respect to specified criteria, and the operation of the battery cells is monitored with respect to a state of health (SoH) and/or an expected lifetime of the battery cells.

23. The system of claim 13, wherein the battery cells are grouped into battery modules according to monitored battery parameters and to reduce intra-module cell variability with respect to inter-module cell variability, and the management module is further configured to re-group the battery cells into the battery modules upon changes in the specified operation scenario and/or the specified optimization parameters.

24. The system according to claim 13, wherein the performing of the multiple group-wise measurements reduces a number of measurements from $O(n)$ to $O(\sqrt{n})$ or less, n denoting a number of the battery cells.

* * * * *